US012288575B2

(12) United States Patent
Khan et al.

(10) Patent No.: US 12,288,575 B2
(45) Date of Patent: *Apr. 29, 2025

(54) ADHESIVE FOR PROCESSING A MICROELECTRONIC SUBSTRATE, AND RELATED METHODS

(71) Applicant: Seagate Technology LLC, Fremont, CA (US)

(72) Inventors: Zubair Ahmed Khan, Villa Park, IL (US); Dat Quach, Savage, MN (US); Andrew Habermas, Bloomington, MN (US); Joel William Hoehn, Hudson, WI (US)

(73) Assignee: Seagate Technology LLC, Fremont, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 18/224,910

(22) Filed: Jul. 21, 2023

(65) Prior Publication Data

US 2023/0360672 A1    Nov. 9, 2023

Related U.S. Application Data

(62) Division of application No. 16/661,564, filed on Oct. 23, 2019, now Pat. No. 11,749,300, which is a
(Continued)

(51) Int. Cl.
*G11B 5/31*    (2006.01)
*B24B 37/04*    (2012.01)
(Continued)

(52) U.S. Cl.
CPC .......... *G11B 5/3169* (2013.01); *B24B 37/048* (2013.01); *C09J 7/38* (2018.01);
(Continued)

(58) Field of Classification Search
CPC .......... G11B 5/3169; C09J 7/38; C09J 33/10; B24B 37/048
See application file for complete search history.

(56) References Cited

U.S. PATENT DOCUMENTS 4,274,991 A    6/1981 Hinz et al.
5,117,589 A    6/1992 Bischoff et al.
(Continued)

FOREIGN PATENT DOCUMENTS

WO    9608367 A2    3/1996

OTHER PUBLICATIONS

D. Satas, Handbook of Pressure-sensitive adhesives, 2nd edition, p. 172, 1969, (1 page).
(Continued)

*Primary Examiner* — Nathan T Leong
(74) *Attorney, Agent, or Firm* — Kagan Binder, PLLC

(57) ABSTRACT

Described are methods for processing microelectronic device substrates by a lapping step, e.g., a final lapping step, wherein the step includes the use of an elastomeric pressure-sensitive adhesive to secure the microelectronic device substrate to a carrier that holds the substrate to a surface of the carrier during the lapping step, and wherein the pressure-sensitive adhesive can be a non-polysilicone based adhesive having mechanical properties that include a tan delta that is below about 0.2.

20 Claims, 1 Drawing Sheet

Related U.S. Application Data division of application No. 15/799,264, filed on Oct. 31, 2017, now Pat. No. 10,465,099.

(60) Provisional application No. 62/417,641, filed on Nov. 4, 2016.

(51) Int. Cl.
| | |
|---|---|
| *C09J 7/38* | (2018.01) |
| *C09J 133/10* | (2006.01) |
| *C09J 175/04* | (2006.01) |
| *H01L 21/304* | (2006.01) |
| *H01L 21/683* | (2006.01) |
| *C09J 175/08* | (2006.01) |

(52) U.S. Cl.
CPC ........... *C09J 133/10* (2013.01); *C09J 175/04* (2013.01); *H01L 21/304* (2013.01); *H01L 21/6836* (2013.01); *C08G 2170/40* (2013.01); *C09J 175/08* (2013.01); *C09J 2203/326* (2013.01); *C09J 2433/00* (2013.01); *C09J 2475/00* (2013.01); *H01L 2221/68327* (2013.01)

(56) References Cited

U.S. PATENT DOCUMENTS

| | | | |
|---|---|---|---|
| 5,591,820 A | 1/1997 | Kydonieus et al. | |
| 6,093,083 A | 7/2000 | Lackey | |
| 6,344,949 B1 | 2/2002 | Albrecht et al. | |
| 6,374,479 B1 | 4/2002 | Sasaki et al. | |
| 6,471,882 B1 | 10/2002 | Namikawa et al. | |
| 6,475,064 B2 | 11/2002 | Hao et al. | |
| 6,662,069 B1 | 12/2003 | Khlif | |
| 6,663,817 B1 | 12/2003 | Chang et al. | |
| 7,196,872 B2 | 3/2007 | Chaw et al. | |
| 7,504,038 B2 | 3/2009 | Bietsch et al. | |
| 8,066,547 B1 | 11/2011 | Schuh et al. | |
| 8,883,281 B2* | 11/2014 | Liu | B32B 27/281 428/40.1 |
| 9,017,139 B2 | 4/2015 | Ronshaugen et al. | |
| 9,352,442 B2 | 5/2016 | Tan et al. | |
| 10,183,376 B1 | 1/2019 | Xiong et al. | |
| 10,465,099 B1 | 11/2019 | Khan et al. | |
| 11,749,300 B2 | 9/2023 | Khan et al. | |
| 2004/0259474 A1 | 12/2004 | Oyama et al. | |
| 2007/0172649 A1 | 7/2007 | Aihara et al. | |
| 2010/0124627 A1 | 5/2010 | Nonaka et al. | |
| 2010/0162556 A1 | 7/2010 | Guruz et al. | |
| 2012/0009399 A1 | 1/2012 | Nonaka et al. | |
| 2014/0273764 A1* | 9/2014 | Ronshaugen | B24B 37/048 451/364 |
| 2016/0215178 A1 | 7/2016 | Inenaga et al. | |
| 2018/0291238 A1 | 10/2018 | Erdogan-Haug et al. | |
| 2019/0010361 A1 | 1/2019 | Hoshi et al. | |
| 2019/0062608 A1 | 2/2019 | Aloshyna ep Lesuffleur et al. | |

OTHER PUBLICATIONS

"Alkylsulfonic acid ester of phenol", LANXESS Energizing Chemistry, Product Safety Assessment, Last Revised Aug. 2018, (3 pages).

Khan et al., Utility U.S. Appl. No. 16/715,913, filed Dec. 16, 2019 (Not attached).

* cited by examiner

ADHESIVE FOR PROCESSING A MICROELECTRONIC SUBSTRATE, AND RELATED METHODS

This application is a divisional patent application of continuation patent application Ser. No. 16/661,564 filed on Oct. 23, 2019, and published as U.S. Pub. No.: 2020/0090687 (Khan et al.), which in turn claims the benefit of nonprovisional patent application Ser. No. 15/799,264 filed on Oct. 31, 2017, now issued as U.S. Pat. No. 10,465,099 (Khan et al.), which in turn claims the benefit of commonly owned provisional applications: Ser. No. 62/417,641, filed on Nov. 4, 2016; wherein the entirety of each of said applications is incorporated herein by reference.

FIELD OF THE INVENTION

This invention relates to methods for processing microelectronic device substrates by what is referred to in the microelectronic device arts as a lapping step, e.g., a final lapping step which is sometimes also referred to as an "Actuated Kiss lap process" ("AKL") or a "final polishing step," wherein the step includes the use of an elastomeric pressure-sensitive adhesive to secure the microelectronic device substrate to a carrier that holds the substrate to a surface of the carrier during the lapping step.

BACKGROUND

Many types of microelectronic devices or precursors of microelectronic devices are prepared by methods that include a "lapping" process, which is a step or series of steps of abrading a surface of the device or precursor (i.e., a "substrate") to remove material from the surface. Material may be removed for one or more of: preparing a flat (planarized) surface; producing a desired feature height or "depth" at one area of the surface; producing a desired shape of the surface; or for a combination of these different purposes. The type of microelectronic device or precursor being processed will vary and may include devices and precursors such as integrated circuits, optical devices, and magnetic read and read-write heads that include a slider.

A specific example of a type of microelectronic device that is commonly prepared by steps that include lapping is a "slider assembly" (alternately referred to as a "head assembly") for use in a hard disk drive system. Hard disk drive systems (HDDs) include one or more magnetic data storage disks. A transducing head carried by a slider assembly near the disk, while the disk spins, is used to read from or write to data tracks on the magnetic disk. The slider assembly includes a transducing read head, a transducing write head, or both, along with a "slider element" that includes a surface that faces the spinning disk and acts as an "air bearing" relative to the spinning disk. During use, the slider assembly is carried at a location very close to the spinning disk surface, but not in contact with the disk surface. The transducing (read or write) head must be suspended or "fly" over the spinning disk surface at a predetermined head-to-disk spacing. To maintain a consistent distance between the rotating disk and the head assembly, the surface of the slider element is shaped to create a layer of air in-between the rotating disk surface and the suspended head assembly. The layer of air produces an aerodynamic force against the head assembly so as to urge the head assembly away from the surface of the rotating disk. A load force provided by a flexure or spring that carries the head assembly opposes the aerodynamic force, and the resultant of the two opposing forces determines the flying height of the head assembly.

A slider assembly, including one or more transducing heads and the slider element, is typically produced by using thin film deposition techniques also used to produce many other microelectronic devices. In a typical process, an array of slider assemblies is formed on a common substrate or wafer. Each slider assembly contains at least one transducing head, as well as a slider element having a surface on one side of the slider assembly. After forming the wafer to contain a large number of slider assemblies, the wafer is sliced into a number of groups of connected slider assemblies for further processing. By some methods, rows or "bars" ("slider bars") of slider assemblies are cut from the wafer, with each slider bar having a number (e.g., seventy) of slider assemblies connected in a side-by-side pattern on each bar.

Typically, the slider bars (containing multiple, connected slider assemblies) are processed by a lapping step. The lapping step processes the surfaces of the slider assemblies to remove a small or minute amount of material from each slider assembly surface to result in a desired thickness or depth (referred to as the "stripe height") between that surface and one or more transducer heads of the slider assembly, which are located adjacent to and below that surface. Lapping is also performed and can be effective to remove material from the slider element of slider assemblies, to produce a desired surface shape.

To carry out the lapping process, a microelectronic device substrate (e.g., a slider bar) is secured to a carrier, and the carrier is used to hold a surface of the substrate against a moving abrasive material, with a light amount of pressure. Contacting the surface of the substrate with the abrasive material, with relative motion between the surface and the abrasive material, is effective to remove small or minute amounts of material from the surface of the substrate. A lubricant such as mineral oil is also normally present at the interface between the substrate surface and the moving abrasive material. The substrate is commonly secured to a surface of the carrier by a pressure-sensitive adhesive, which must exhibit certain specific performance requirements to be useful for this purpose, such as generally providing a secure engagement between a surface of substrate and a surface of the carrier, even in the presence of a lubricant.

Industry standard adhesives for securing a microelectronic device substrate to a carrier for a lapping step include silicone-based (polymeric silicone-based, e.g., polydimethylsiloxane) pressure-sensitive adhesives. But silicone-based adhesives have disadvantages in that they tend to swell or leach during processing, e.g., in the presence of certain lubricants used in lapping processes, which causes contamination of a substrate that is being processed by the lapping step, of the lapping equipment, or both. Silicone can be highly problematic if present as a contaminant of a microelectronic device, even if present at only a very tiny amount. Unlike organic contaminants, silicone cannot be oxidized by atomic oxygen. If oxidization of a silicone contaminant at a substrate surface is attempted, a glassy silicate, which is very difficult to remove, will be formed and will remain at the surface. Silicones, being useful as release agents, also cause great difficulties in trying to bond an applied layer of material to a surface that is contaminated with a silicone; as an example, if metallization is attempted on a surface that is contaminated with silicone, adhesion is greatly diminished. Silicone contamination of magnetic and chemical sensors can be highly problematic; even parts-per-million amounts of silicone present on a surface of a sensor can dramatically and quickly impede performance of the sensor. Minimal exposure of a hard disk read-write head to silicone can result in errors or drive failure.

As a general matter, an improvement in any aspect of the various processes used to produce microelectronic devices will always be desired. With more specific regard to lapping steps, the Applicant has now discovered that certain types of non-silicone-based pressure-sensitive adhesives can be successfully used to secure a microelectronic device substrate to a carrier, with useful or advantageous results. This discovery will allow for the elimination of the negative effects that result from using standard silicone-based adhesives in lapping steps.

SUMMARY

The invention relates to methods for processing microelectronic device substrates by what is referred to in the microelectronic device arts as a lapping step. Example methods of the invention more particularly involve processing a microelectronic device substrate by a final lapping step, also referred to as a "kiss lapping step" or a "polishing lapping step." The inventive lapping step uses a pressure-sensitive adhesive to secure a microelectronic device substrate to a carrier, to hold the substrate to a surface of the carrier during the lapping step. The pressure-sensitive adhesive is one that is not silicone-based and does not require any silicone-based adhesive material, and may contain substantially or entirely only non-silicone-based materials such as polyacrylate or polyurethane materials. Preferred adhesives also are not required to contain and can specifically exclude the presence of tin (e.g., as a catalyst material for certain adhesive polymers). Useful and preferred pressure-sensitive adhesives of the invention exhibit mechanical properties and adhesive properties (see below) that have been found to provide especially desirable results in a final lapping step when used to secure the substrate to the carrier surface.

A final lapping step can be designed to accomplish one or two important objectives. A first objective can be to remove an amount of material from a surface of the substrate to produce a desired thickness of a layer of the surface material. A lapping step may be performed, for example, to produce a desired thickness of layer of surface material that covers an underlying electronic feature, often as a transducer. Another possible objective is, by removal of the surface layer material, to produce a desired shape of a surface of the substrate, for example a desired shape of a surface of a slider element of a slider assembly.

The presently-described methods may be useful or even advantageous when processing any type of microelectronic device substrate by a lapping step. The substrate may be any microelectronic device or a precursor thereof that is produced using thin film deposition techniques to selectively deposit onto a substrate (e.g., wafer), and then remove, multiple layers of materials that will function as conductive, semiconductive, or insulating features of a microelectronic device. The substrate may be ceramic, metal, or semiconducting material, etc. The materials that are selectively applied and removed to form the functioning microelectronic features may be metals, alloys, insulating materials, semiconducting materials, etc.

Types of microelectronic devices prepared in this manner include devices that contain integrated circuits, optical devices, or transducer heads (magnetic read and read-write heads, among others. Many details of the present description are presented in terms of a lapping step for processing a microelectronic device substrate that is a "slider bar," meaning a bar of multiple slider assemblies that are connected at their length-wise edges. While the present description is presented in large part as applying to lapping steps for processing slider assemblies, the invention, including the use of a pressure-sensitive adhesive as described herein, is not limited to a lapping process or lapping step that operates on a slider assembly as the substrate. Instead, while slider assemblies (and, more particularly a slider bar) are exemplary substrates, inventive lapping steps as described can be used with any type of microelectronic device substrate that can be processed in a useful manner by a lapping step, including microelectronic device substrates that are different from slider assemblies and slider bars, including devices and their precursors that are designed to function as optical devices, memory devices, integrated circuits, among others.

For use with a microelectronic device substrate (or just "substrate," for short) that is a slider bar that includes one or more slider assemblies, a lapping step as described can have a purpose of removing a very precise and typically very small amount of material from a surface of the substrate that covers one or more transducer heads, e.g., a read head, a write head, or (typically) both. The lapping step is performed to remove an amount of material from a surface of the slider assembly (an amount of "surface layer material") that is located between the slider assembly surface and the one or more transducer heads. The amount of material removed is an amount that will result in a desired thickness of that surface layer material remaining between the surface and the one or more transducer heads at the end of the lapping step. The amount of that material left to remain after the lapping step, based on thickness, is referred to as "stripe height," and is an amount that results in desired performance of the transducer heads when the slider assembly functions as part of a slider assembly (a.k.a., "head assembly") of a hard magnetic disk drive. The amount of the surface layer material that is removed from a slider bar as a substrate to produce a desired stripe height of slider assemblies of the slider bar can be measured electronically during the a kiss lapping process, and is typically less than about 100 nanometers.

As another objective of a lapping step for processing a microelectronic device substrate that is a slider bar or that includes one or more slider assemblies, the lapping step can be performed to produce a desired surface shape of a slider element of the slider assembly. The slider element of a slide assembly includes a surface that, during use of the slider assembly in a hard disk drive, faces a surface of a spinning hard drive magnetic disk. The slider element surface acts as an air bearing that holds the slider assembly, including its transducer head or heads, at a desired height relative to the spinning surface of the magnetic hard drive disk. During a lapping step, especially a final lapping step (a "polishing lapping step" or a "kiss lapping step"), that surface of the slider element that will face the spinning disk surface during use can be specially shaped so that it will properly function as an air bearing. This shaping of the slider assembly surface during a kiss lapping step can be referred to as global shaping of the surface.

The invention relates to the novel and inventive uses of certain types of elastomeric, pressure-sensitive adhesives in a lapping step to secure a microelectronic device substrate to a carrier, during lapping. According to the invention, certain specific physical and adhesion properties have been identified as being useful or preferred in a pressure-sensitive adhesive used for holding the microelectronic device substrate at the surface of a carrier, especially during a kiss lapping step. These properties include, alone or in combination: desired elasticity and flow properties including elastic modulus, loss modulus, and "tan delta"; peel force as measured in a shear direction; tack; and chemical resistance to lubricant materials used in a lapping step such as mineral oil.

According to the present description, the term "pressure-sensitive adhesive" (PSA) is used as that term is generally used and understood in the chemical and adhesive arts, to describe materials that are inherently tacky or, by the addition of tackifying resins ("tackifiers") are formulated to be tacky, meaning sticky to the touch at a surface. Examples of materials that are classified as pressure-sensitive adhesives are described in D. Satas, *Handbook of Pressure-sensitive adhesives*, $2^{nd}$ edition, page 172, 1989.

In a kiss lapping process a carrier is used to hold a microelectronic device substrate, and to handle the substrate to place the substrate in contact with a moving (e.g. rotating) abrasive material, at a desired pressure, for an amount of time that is effective to remove a desired amount of material from the surface of the substrate that is held in contact with the moving abrasive (sometimes referred to herein as the "contacted surface"). During lapping, as the substrate is held in contact with the moving abrasive material, and surface layer material is removed from the contacted surface, frictional forces are placed on the surface of the substrate that contacts the abrasive. The forces will remove material from the contacted surface and will also produce a force at the contacted surface in a direction of movement of the abrasive material relative to the contacted surface, i.e., along the contacted surface in a direction from the "forward end" to a "trailing end" of the surface. This force will cause an amount of torque to be produced on the substrate, causing the leading end to be drawn toward the abrasive material. That torque can, in turn, become applied to the pressure-sensitive adhesive that holds the opposite ("non-contacted") surface of the substrate to the carrier. Depending on the mechanical properties of the adhesive, e.g., elasticity and flow properties as measured by modulus and tan delta, the adhesive may be capable of allowing or preventing useful lapping of the substrate in the presence of the applied torque. More specifically with respect to lapping a slider assembly or slider bar, mechanical properties of the pressure-sensitive adhesive will affect the amount of material that is removed from a surface of a slider element portion of a slider assembly substrate, especially at and toward the leading end of the substrate, thus affecting the global shaping of the slider element.

Accordingly, mechanical properties, as well as adhesive properties of an adhesive used in a lapping step can be of high importance, with certain properties now being identified as particularly desired for the adhesive to perform well as a lapping adhesive. These properties include the elasticity of the adhesive (modulus) and the "tan delta," which is related to elasticity (e.g., elastic modulus). Also important is the adhesive peel strength (peel force, e.g., measured in a shear direction) of the adhesive. In addition to these mechanical and adhesion properties, the adhesive must be sufficiently resistant to chemical materials that are also present in a lapping step, one common material being mineral oil, used as a lubricant. Resistance to mineral oil means that the adhesive does not degrade in the presence of mineral oil, and is dimensionally stable in the presence of mineral oil, at least to degrees that are sufficient for the adhesive to be useful in a lapping step as described.

An important mechanical property of a lapping adhesive is elasticity measured as elastic modulus (G' or "storage modulus"), which relates to the flexibility of the adhesive. Flexibility of the adhesive allows for movement (deformation) of the adhesive while the adhesive holds the substrate onto a surface of a carrier while the substrate contacts a moving abrasive material during lapping. Depending on its elasticity, the adhesive will allow for a greater or a lesser amount of movement, e.g., twisting (about an axis extending along a length (the longest dimension) of a slider bar substrate) of the substrate in response to the torque applied to the substrate by the abrasive material moving against the contacted surface. A greater or lesser elasticity of the adhesive will allow for more or less twisting of the substrate, resulting in either a greater or a lesser amount of material being removed from the substrate, especially at a forward end of the substrate, and a greater or a lesser degree of global shaping of the substrate being produced during lapping. Loss modulus (G") is another important mechanical property of the adhesive, and relates to flow properties of the adhesive. Like the elastic modulus ("storage modulus"), the loss modulus of the adhesive also affects the global shaping of the substrate during lapping by allowing for more or less twisting of the substrate and a greater or a lesser amount of material being removed from a leading end of the substrate.

Elastic modulus (or "storage modulus") (G') and loss modulus (G") can be considered together as a single unit-less value known as "tan delta," which is the unit-less value derived by dividing the loss modulus by the storage modulus, i.e.: tan delta is the value of G"/G'. According to certain preferred adhesives of the present description, a useful tan delta of the adhesive can be below about 0.2, e.g., in a range from about 0.05 to 0.2, such as in a range from about 0.08 to 1.5.

Peel force and tack are adhesive properties of pressure-sensitive adhesives. The peel adhesion and tack should be sufficient to cause a substrate to securely adhere to the adhesive, and consequently to a surface of a carrier, during lapping, without allowing for failure during the lapping process, and also to allow for removal of the substrate from the carrier after a lapping step without causing damage to the substrate. If peel adhesion or tack is too low, a substrate such as a slider bar may not adhere to the adhesive and to the carrier during the lapping step. If peel adhesion or tack is too high, the substrate (e.g., slider bar) may be difficult to remove from the adhesive and the carrier following lapping, and the substrate may be damaged during its removal from the carrier. According to certain preferred adhesives of the present description, a useful peel force of the adhesive can be in a range from about 50 to 1000 grams (force), such as from about 70 to 500 or from about 100 to 250 grams force.

Many past and presently-conventional pressure-sensitive adhesives used in lapping steps are silicone-based, meaning adhesives that contain a high amount of silicone-based adhesive polymer such as polydimethylsiloxane as the functioning adhesive. According to the present description, non-silicone-based pressure-sensitive adhesives have now been found to be useful and advantageous for use as a lapping adhesive as described, preferably including mechanical, adhesive, and chemical properties as described herein. Examples of such non-silicone-based adhesives include polyurethane-based pressure-sensitive adhesives and polyacrylate pressure-sensitive adhesives (meaning pressure-sensitive adhesives derived from acrylate monomers, methacrylate monomers, or combinations thereof). Preferred adhesives as described can contain not more than a minor amount of silicone-based polymer, e.g., polydimethylsiloxane, or essentially no silicone-based polymer, e.g., less than 5, 1, 0.5, or 0.1 weight percent silicone-based polymer, based on total weight of the adhesive.

Many known and conventional polyurethane adhesives include tin used as a catalyst for a polymerization reaction to form polyurethane polymer of the adhesive. Tin, however, can be disfavored for industrial uses, such as for uses in microelectronics manufacturing. According to the invention, polyurethane pressure-sensitive adhesives that have been identified for use in a lapping process as described do not require and can preferably exclude the use of tin as a catalyst, or for any other purpose in the adhesive. Preferred polyurethane pressure-sensitive adhesives as described herein can be "free of tin," which means that the adhesive can include a non-tin-containing catalyst (e.g., a bismuth-based catalyst) and does not contain a tin-containing catalyst, or, alternately stated, can include less than 100 parts per million (ppm), e.g., less than 50, 10, 1, or 0.1 ppm tin, based on total weight of the adhesive.

In one aspect, the invention relates to a method of lapping a microelectronic device substrate. The method includes providing a carrier and providing a pressure-sensitive adhesive film, and, in any order effective to secure the substrate to the carrier: placing the pressure-sensitive adhesive film on the carrier, and placing the microelectronic device substrate in contact with the adhesive film. The method then includes lapping the microelectronic device substrate, while the substrate is secured to the carrier by the pressure-sensitive adhesive. The adhesive film includes adhesive polymer and can optionally and preferably have an elastic modulus in a range from 100 to 500 kilopascals, a Tan Delta in a range from 0.05 to 0.2, or both.

In another aspect the invention relates to elastomeric adhesive film comprising adhesive polymer, the adhesive film being useful to adhere a microelectronic device substrate to a carrier during a step of lapping a surface of the microelectronic substrate. The adhesive film can optionally and preferably have mechanical properties that include an elastic modulus in a range from 100 to 500 kilopascals, a Tan Delta in a range from 0.05 to 0.2, or both.

In yet another aspect, the invention relates to a stack comprising an adhesive film of the present description in contact with a release liner, e.g., with the adhesive film of the stack having a thickness in a range from 14 to 21 mils.

Figure 1:
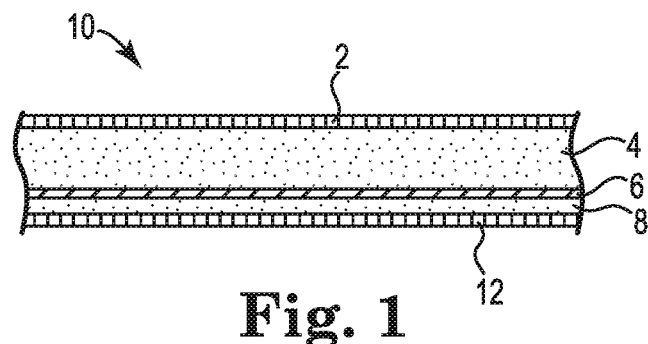
FIG. 1 is an example of an adhesive product of the present description, the embodiment shown being a stack that contains a non-silicone pressure-sensitive adhesive as described along with other optional layers.

The drawings are schematic and not to scale.

DETAILED DESCRIPTION

The invention as described herein relates to pressure-sensitive adhesives that have now been identified as providing useful or advantageous performance when used in methods of lapping microelectronic device substrates.

The substrate may be any type of microelectronic device that can be processed by lapping, with examples including microelectronic device substrates that include integrated circuits, memory components, optical components, or a slider assembly (including a slider bar, or slider row containing multiple slider assemblies), or a precursor of any of these. In a lapping step, an amount of material is removed from a surface of the substrate. The type of material may differ depending on the substrate. For a substrate that is a slider assembly or that contains multiple slider assemblies, a surface layer may be made of a combination of aluminum oxide ($Al_2O_3$) and titanium carbide (TiC).

In a lapping step, a holder or "carrier" of a lapping apparatus is used to hold a microelectronic device substrate such as a slider bar in contact with a moving abrasive material. As the substrate is held in contact with the moving abrasive material, and as material is removed from the surface of the substrate that contacts the moving abrasive, frictional forces are produced on the contacted surface. The combination of friction and movement between the abrasive material and the contacted surface will produce a force on the substrate in the direction of movement of the abrasive material relative to the substrate. Torque is produced on the substrate, causing the leading end (the end of the substrate that first comes into contact with the moving abrasive material) of the substrate to be drawn toward the abrasive material and, in turn, allowing for or causing a larger amount of surface layer material to be removed from the leading end of the substrate, thereby producing a shaped surface having more material removed from the surface at the leading end relative to the trailing end. The amount and form of the shaping of the surface (global shaping) will be affected by the mechanical properties of the adhesive, e.g., elasticity and flow properties (cohesive strength), which will allow for more or less movement (twisting) of the substrate as a result of the torque. When processing a slider element by lapping, the mechanical properties of the pressure-sensitive adhesive, and their effects on the amount of material that is removed from the contacted surface at the leading end, which is the location of the slider element portion of a slider assembly, thereby affect the global shaping of the slider element.

To produce a slider assembly having controlled, useful, or advantageous shaping of the surface of the slider element, along with a desired amount of removal of material from other portions of the slider assembly, such as at the trailing end (measured by "stripe height"), it has now been discovered that a pressure-sensitive adhesive that secures the slider assembly to the carrier can have an elasticity, measured as elastic modulus (G' or "storage modulus"), in a desired range. A preferred elasticity will allow for a desired (e.g., controlled) amount of movement of the substrate relative to the carrier and the moving abrasive (i.e., twisting of the substrate about an axis of the substrate that is co-planar with the surface of the abrasive material, and that is perpendicular to the direction of relative motion between the substrate and the moving abrasive material) in response to the torque that is applied to the substrate by the moving abrasive material contacting the contacted surface. According to methods of the present invention, preferred storage modulus of a pressure-sensitive adhesive for use in a lapping process, e.g., a kiss lapping step, can be in a range from about 100 to about 500 kilopascals.

Along with the elastic modulus ("storage modulus"), the loss modulus (G") of the adhesive also affects the removal of material from a substrate surface during lapping, and influences the global shaping of the substrate by allowing for a greater or a lesser amount of material to be removed from the leading end of the substrate due to controlled twisting of the substrate relative to the carrier and the moving abrasive due to torque resulting from applied frictional forces. The elastic modulus (or "storage modulus") (G') and loss modulus (G″) can be considered together as a single unit-less value known as "tan delta," which is the ratio of loss modulus divided by storage modulus, G″/G′. According to preferred embodiments of the invention, preferred adhesives can have a tan delta that does not exceed about 0.2, e.g., a tan delta in a range from 0.05 to 0.2.

Modulus, including both elastic modulus and loss modulus, can be measured by known techniques and using equipment that is known and commercially available. One well-understood method for measuring modulus and related mechanical properties (e.g., tan delta) of elastomeric adhesives is dynamic mechanical analysis (DMA), by use of a parallel plate rheometer (or oscillatory rheometer) programmed to characterize the physical properties of a sample of adhesive. Various commercial rheometers are available from companies that include TA Instruments (New Castle, Delaware, USA) and Anton Paar GmbH, Austria. According to the present description, elastic modulus, loss modulus, and tan delta, can be measured, of a pressure-sensitive adhesive as described, by use of a commercially available rheometer (such as a Modular Compact Rheometer MCR 302 from Anton Paar) using settings that include a temperature of 25 degrees Celsius, a frequency of 10 hertz, an amplitude of 10 millirad, and a strain of 0.2 percent. For a "frequency sweep" test method wherein the angle of oscillatory movement and the temperature are held constant, the frequency can be varied from 100 hertz to 0.1 hertz.

According to specific preferred adhesives as described, and methods of their use in lapping procedures, the modulus and tan delta of the adhesive can be within ranges specified herein when measured as described, to provide the adhesive with mechanical (e.g., flow and elasticity) properties that are useful or especially effective in a lapping step for processing a microelectronic substrate such as a substrate that includes a slider assembly. Such mechanical properties have been identified as being particularly useful to provide flow and elasticity properties that result in a desired level of flexibility, resulting in a very slight amount of controlled movement of the substrate, especially twisting, relative to the carrier and the moving abrasive. Such slight controlled movement can result in a useful, desired, or advantageous degree and form of global shaping of a slider element surface of a slider assembly during kiss lapping. According to certain particularly preferred pressure-sensitive adhesives now discovered to be useful for providing these desired or improved effects during lapping, including polyurethane-based and polyacrylate-based pressure-sensitive adhesives, an elastic modulus (storage modulus, G′) of the adhesive can be in a range from about 100 to about 500 kilopascals, while the tan delta is below about 0.2, such as in a range from about 0.05 to 0.2.

Another property of an adhesive that is important in a lapping process is peel adhesion or peel strength of the adhesive, which is a measure of the bond strength created, e.g., in a shear direction, between a surface of a substrate and a surface of the adhesive that contacts the surface of the substrate. According to certain preferred adhesives of the present description, in addition to an elastic modulus and a tan delta as specified herein, particularly preferred adhesives can exhibit a peel force of in a range from about 50 to 1000 grams (force), such as from about 70 to 500 or from about 100 to 250 grams force.

Peel force can be measured by known techniques and using equipment that is known and commercially available. One well-understood method for measuring peel force is by use of a shear tester apparatus, such as one sold under the trade name Dage, e.g., of the Dage 5000 series. According to the present description, peel force of an adhesive as described can be measured by this instrument or a similar instrument using a 5000 kilogram (kg) (or 1000 kg) load cell, a 100 gram test load, a test speed of 25 microns per second, a shear height of 20 microns, and a BST-1.00 Dage DWG test needle.

According to the invention, elastomeric pressure-sensitive adhesives for the highly-sensitive final polishing step of a microelectronic device substrate such as a slider assembly have been found to benefit from or to require a combination of very particular mechanical, adhesive, and chemical properties, including one or a combination of: elastic modulus, Tan Delta, peel strength, and dimensional stability (resistance to mineral oil). Industry standard adhesives are silicone-based (e.g., polydimethylsiloxane). But silicone-based adhesives tend to swell or leach during processing, causing contamination of lapping equipment, substrates, or both. Previously, polyurethane and polyacrylate (including polymethacrylate) adhesives have not been successfully formulated to be useful for securing a microelectronic device substrate to a carrier during a lapping step. According to the invention, useful adhesives can be prepared substantially or entirely from non-silicone-based polymers such as polyacrylates (including polymethacrylates) and polyurethanes. Moreover, while many polyurethane adhesives contain tin as a catalyst, which is not compatible with microelectronics processing, preferred polyurethane adhesives need not contain tin as a catalyst, and may instead contain a bismuth-based catalyst, which is acceptable for microelectronic processing.

An adhesive as described (independent of polymer chemistry) can contain minimal or no solvent, e.g., can contain one-hundred percent solids, and can be non-foamed, with a low amount of bubbles or voids. For example, the adhesive can contain less than 5, 2, 1, or 0.5 weight percent solvent and can contain substantially no bubbles or entrained gases, e.g., less than 5, 2, 1, or 0.5 percent gaseous bubbles by volume. In some embodiments, he adhesive can contain a high amount of polyurethane, polyacrylate, or a combination of these materials as an adhesive material, with minor or no amounts of other adhesive materials or non-adhesive additives. In these or other embodiments, additives such as a tackifier, plasticizer, or both may be present in a minor but useful amount. Example adhesives can be substantially entirely polyurethane, polyacrylate, or a combination thereof, such as at least 70, 80, 90, 95, or 99 weight percent polyurethane, polyacrylate, or a combination thereof, based on total weight adhesive. These or other example adhesives can be substantially entirely polyurethane, polyacrylate, or a combination thereof with optional tackifier, plasticizer, or both, such as at least 70, 80, 90, 95, or 99 weight percent polyurethane, polyacrylate, or a combination thereof, and tackifier, plasticizer, or both.

Elastomeric polyurethane materials are known in the chemical, polymer, and adhesives arts and, according to the invention, can be used to prepare a polyurethane pressure-sensitive adhesive having mechanical (e.g., elastic and flow properties), adhesive, and chemical properties as described.

Polyurethanes are polymers composed of organic units joined by carbamate (urethane) links. Preferred polyurethane adhesives, being elastomeric, are also thermoplastic, meaning that the polymeric composition can be melted and re-heated and re-formed.

Useful polyurethanes can be formed by reacting a polyisocyanate compound with a compound that has reactive hydrogens (e.g., hydroxide moieties) capable of reacting with the isocyanate groups, one example of such a compound being a polyol. The polyisocyanate compound can be a di-isocyanate monomer that can react directly with the reactive-hydrogen-containing compound (e.g., polyol, see below), or can be a compound that is derived from pre-reacting di-isocyanate monomers to form a polyisocyanate compound that is an oligomer, pre-polymer, or polymer, etc., of polyisocyanate (e.g., di-isocyanate) monomers.

Examples of preferred polyisocyanate monomers are di-isocyanate monomers that contain two reactive isocyanate (NCO—) moieties. More specific example are compounds that include two reactive isocyanate moieties attached to a non-reactive aliphatic or a non-reactive aromatic compound (or "radical"). Some exemplary aromatic di-isocyanates monomers include diphenylmethane di-isocyanate (MDI) and toluene di-isocyanate (TDI). Some exemplary aliphatic di-isocyanate monomers include hexamethylene di-isocyanate (HDI), isophorone di-isocyanate (IPDI), among others. The polyisocyanate monomer useful to prepare the polyurethane or a pre-polymer or oligomer precursor can contain a high level of di-functional polyisocyanate monomers (as opposed to tri- or higher functionalities), e.g., exclusively di-functional monomers, such as at least 90, 95, or 99 percent by weight di-functional isocyanate monomers based on total weight polyisocyanate monomers, i.e., the average functionality of the polyisocyanate monomer can be below 3, e.g., below about 2.5, 2.2, or 2.1.

The polyurethane polymer is prepared by the condensation reaction between the polyisocyanate and an active-hydrogen-containing material such as a hydroxyl(-OH)-containing material, e.g., polyol. Preferably, di-isocyanate monomer or an oligomer, pre-polymer, or polymer thereof, can be combined and reacted with a material that includes multiple reactive hydrogens, such as a compound (e.g., monomer, oligomer, pre-polymer, polymer, etc.) that includes multiple (especially two) hydroxyl (—OH, or alcohol) moieties, especially a polyol, such as a diol, e.g., a polyether polyol.

A useful polyol can be any polyol that is capable of forming a polyurethane adhesive as described, having useful or preferred mechanical properties and adhesive properties, etc. The polyol can be of any molecular weight that will be useful to react with the polyisocyanate to provide a polyurethane adhesive as described, having desired mechanical, adhesive, and chemical properties, and may contain a base compound or backbone of an oligomer, polymer, or pre-polymer of any desired chemistry, such as aliphatic, aromatic, polyether, polyester, etc. Exemplary polyols include polyether polyols and polyesters. The polyol (e.g., monomer, oligomer, or polymer) can be of any molecular weight, e.g., a molecular weight of below about 1,000, such as below about 500, 400, or 300.

A useful polyol may preferably contain a high level of di-functional monomers, e.g., diols, preferably at least about 90, 95, or 99 percent by weight diols, as opposed to higher-functionality polyols such as triols; i.e., the average functionality of the polyol can be below 3, e.g., below about 2.5, 2.2, or 2.1.

The relative amount of polyol compound to polyisocyanate compound used to prepare the polyurethane polymer can be any relative amounts that are determined to be useful to provide a pressure-sensitive adhesive as described herein, that has useful or advantageous mechanical and adhesive properties as also described, and, therefore, may be useful or especially useful in a step of lapping a microelectronic device substrate. In certain preferred examples of polyurethane adhesives, the polyurethane polymer can contain relative amounts of polyisocyanate compound to polyol compound in a range from 1:1 to 2:3, i.e., from 40 to 50 parts by weight polyisocyanate compound, and from 50 to 60 parts by weight polyol compound, based on 100 parts by weight total polyisocyanate and polyol compounds.

The reaction of the di-isocyanate and the polyol can be performed in the presence of a catalyst, with heat curing (activation), or both, to produce the polyurethane polymer from the polyisocyanate and polyol compounds. Preferred polyurethanes, if polymerized by use of a catalyst, can be prepared using a catalyst that does not contain tin (i.e., a non-tin catalyst), such as a bismuth-based catalyst, e.g., bismuth carboxylate. Accordingly, preferred polyurethane adhesives are "free of tin," meaning, for example, that the adhesive does not contain a substantial amount of tin as a catalyst and preferably contains less than 1 part per million (ppm), e.g., less than 0.5 or 0.1 ppm tin based on total weight polyurethane adhesive material.

Useful polyacrylate adhesives can be formed by reacting one or a combination of "(meth)acrylate" monomers (the term "(meth)acrylate" referring collectively to acrylate and methacrylate monomers), to form a polymer, which may be a homopolymer or a copolymer. The monomers can be as desired and useful to form a polyacrylate adhesive having properties as described herein, with useful example including methylmethacrylate (MMA), ethyl acrylate (EA), butyl acrylate (BA), hydroxyethylmethacrylate (HEMA), and 1,3-budanediol dimethacrylate (BDDMA).

According to one adhesive embodiment, the polyacrylate adhesive can be a homopolymer of methylmethacrylate, i.e., poly(methylmethacrylate), e.g., can prepared exclusively or nearly exclusively from methylmethacrylate monomers, such as by polymerizing monomer that includes at least 99, 99.5, or 99.9 percent by weight methylmethacrylate monomers.

According to other preferred embodiments, the polyacrylate can be a copolymer of methylmethacrylate and one or more other acrylate or methacrylate comonomers. The comonomer can by any useful monomer, with examples including ethyl acrylate (EA), butyl acrylate (BA), hydroxyethylmethacrylate (HEMA), 1,3-budanediol dimethacrylate (BDDMA), and combinations thereof. A copolymer of methylmethacrylate can contain, for example, from about 50 to 95 parts by weight methylmethacrylate with from 5 to 50 parts by weight (meth)acrylate comonomers, based on total weight copolymer. Example copolymer can contain the methylmethacrylate monomer in combination with one or more of: from 1 to 10, e.g., from 1 to 5 parts by weight ethyl acrylate (EA); from 1 to 10, e.g., from 1 to 5 parts by weight butyl acrylate (BA); from 1 to 10, e.g., from 1 to 5 parts by weight hydroxyethylmethacrylate (HEMA); from 1 to 10, e.g., from 1 to 5 parts by weight 1,3-budanediol dimethacrylate (BDDMA), or two or more of these comonomers in an amount as specified. Example adhesives can be prepared using these monomers, as specified, in the absence or the substantial absence of other monomers, and in the substantial absence of a crosslinking agent such as a poly-functional (meth)acrylate compound that contains 2, 3, or more moieties that are reactive with the (meth)acrylate monomers, e.g., 2, 3, or more reactive (meth)acrylate moieties; such adhesives may contain, e.g., less than 1, 0.5, or 0.1 weight percent of multi-functional (e.g., multi-(meth)acrylate-functional) crosslinking agent.

Preferred adhesives (e.g., polyacrylate or polyurethane) can contain a major amount of the polyacrylate or polyurethane adhesive polymer, such as an amount that is at least 60, 70, 80, 90, or 95 percent by weight of the polyacrylate or polyurethane polymer, based on total weight adhesive.

Optionally, though, as desired, one or more of a plasticizer, a tackifier, or both, may also be included in the adhesive.

A plasticizer is an additive that is chemically different from the adhesive polymer of a pressure-sensitive adhesive composition, and that increases the plasticity or fluidity of a material, e.g., pressure-sensitive adhesive. According to the invention, plasticizer may be added to achieve a desired fluidity and flexibility of the adhesive, to result in mechanical properties (e.g., modulus, tan delta) as described, thereby being useful or especially useful in a kiss lapping step as described. Many examples of plasticizers are known in the adhesive arts. Many common plasticizers are based on esters of carboxylic acids with linear or branched aliphatic alcohols of moderate chain length. Phthalate esters of straight-chain and branched-chain alkyl alcohols are common plasticizers. Other examples include oil esters such as a methyl or ethyl soybean oil ester, which are well known and commercially available from multiple sources. If present, a plasticizer may be present in an amount that has a desired effect on a property of the adhesive such as elastic modulus, loss modulus, or tan delta, example amounts being up to about 20, 10, or weight percent plasticizer based on total weight adhesive.

A tackifier or "tackifier resin" is a material that can be added to a pressure-sensitive adhesive to promote adhesion and tack. Many examples of tackifying resins are known in the pressure-sensitive adhesive arts, the different types having different chemistries, different physical properties such as softening point, ranges of molecular weights and molecular weight distributions, and effective levels of tack or adhesion promotion. Example tackifier resins include both natural and modified resins, polyterpene resins, phenol-modified hydrocarbon resins, aliphatic and aromatic hydrocarbon resins, hydrogenated hydrocarbons, hydrogenated resins, and hydrogenated resin esters and rosins, among others. A tackifier, if present in an adhesive as described, may be included in an amount that results in a desired level of tack, adhesion, or both, at a surface of the pressure-sensitive adhesive, with example amounts being up to about 30, 20, 10, or 5 weight percent based on total weight adhesive.

An adhesive as described can be prepared and handled during use in any convenient fashion. Typically, for use in a lapping step as described, the adhesive should be in the form of a thin, preferably (but not necessarily) continuous layer of the polymerized adhesive material that can be placed between a flat surface of a substrate such as a slider bar, and a flat surface of a carrier. To provide for convenience of use when handling and placing a layer of the adhesive between a surface of a substrate and a surface of a carrier, the adhesive can be placed in contact with a release liner (or "transfer liner" or simply "liner"), which can be a flat film of material that can be useful to receive a film of the adhesive layer, and from which the adhesive layer can be easily and readily removed. Also, optionally, for convenience, an adhesive as described can be part of an adhesive "stack" that includes the adhesive, a release liner placed against one surface of the adhesive, and one or more additional layers such as a base layer on the side of the adhesive opposite of the release liner, a second adhesive (e.g., on the base layer on a side opposite of the adhesive material), and a second release liner in contact with a surface of the second adhesive.

FIG. 1 shows an example of an adhesive stack that includes adhesive as described herein, and that can be conveniently used in a lapping step as described. Referring to FIG. 1, stack 10 includes release liner 2, adhesive layer 4, base layer 6, second adhesive 8, and second release liner 12. Adhesive layer 4 is an adhesive material as described herein, containing a major amount of non-silicone-based pressure-sensitive adhesive, such as a polyurethane adhesive or a polyacrylate adhesive. Second adhesive 8 can be any adhesive that is effective to securely hold to a surface of a carrier during a lapping step. Examples of useful second adhesives include polyacrylate pressure-sensitive adhesives, especially high strength, organic solvent-containing polyacrylate pressure-sensitive adhesives.

Each release liner 2 and release liner 12 may be a polymeric film that is coated on one major surface (the surface facing adhesive 4 or adhesive 8) with a release material (e.g., a silicone material) that will be releasable from, i.e., have low adhesion to, pressure-sensitive adhesive 4 or pressure-sensitive adhesive 8, respectively. Examples of polymeric films that can be coated with a release material, such as silicone, include temperature stable plastic films such as: polyester films, e.g., poly(ethylene terephthalate) (PET) films, poly(ethylene naphthalate) (PEN) film, and poly(butylene terephthalate) (PBT) films; olefinic films prepared from one or more α-olefins as monomer components, such as polyethylene (PE) films, polypropylene (PPs) films, polymethylpentene (PMP) films, ethylene-propylene copolymer films, and ethylene-vinyl acetate copolymer (EVA) films; poly(vinyl chloride) (PVC) films; vinyl acetate resin films; polycarbonate (PC) films; among others.

Base layer 6 may be made of any one or more of these materials, but does not include a release material at a surface and instead includes a surface that is adapted (e.g., primed) to receive and strongly adhere to adhesive 4 and second adhesive 8.

For use in a lapping step as described, a preferred thickness of stack 10, meaning the total thickness all of the release liner 2, adhesive layer 4, base layer 6, second adhesive 8, and second release liner 12, combined, can be in a range from about 25 to 35 mils, e.g., from 25 to 30 mils, or from 26 to 28 mils. A preferred thickness for adhesive layer 4 can be in a range from about 14 to 21 mils, e.g., from 15 to 20 mils. Thicknesses of release liner 2, base layer 6, second adhesive 8, and second release liner 12 can be in ranges useful to allow for a desired total thickness of stack 10, with each of these layers being in a range from 1 to about 10 mil, e.g., about 2, 3, or 5 mil.

Figure 3:
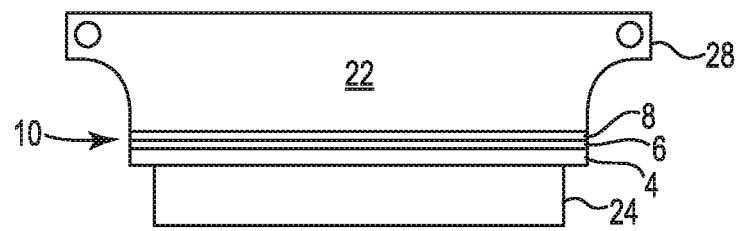
FIG. 3 is a schematic side view of a carrier tool ("carrier" or "lapping carrier") that includes an adhesive as described and a substrate secured to the carrier by the adhesive.

In use, the adhesives of stack 10 can be applied to a carrier by any order of steps that include removing the release liner 2, applying adhesive layer 4 to a surface of a substrate (opposite of a "contacted" surface of a lapping step), removing release liner 12, and applying adhesive layer 8 to a surface of a carrier, to produce a configuration as illustrated at FIG. 3, which shows adhesive layer 8 bonded on one of its surfaces to a surface of carrier 22 and being bonded on a second surface to base layer 6, and adhesive layer 4 being bonded on one surface to a surface of substrate 24 and being bonded on a second surface to base layer 6. Note that adhesive layer 4 need not be in direct contact with the surface of the carrier, but may optionally be adhered indirectly to, or non-directly placed or located on, the surface through one or more additional layers, such as another adhesive layer (e.g., second adhesive 8), a base layer (6) of the described stack 10, or both.

According to methods of the invention, an elastomeric pressure-sensitive adhesive as described, which is non-silicone-based, can be used in a lapping step, e.g., a final lapping step or a "kiss lapping" step, for the purpose of securing a microelectronic device substrate to a carrier, to hold the substrate to a surface of the carrier during the lapping step. The lapping step can be designed to accomplish one or two important objectives. A first objective can be to remove an amount of material from a surface of the substrate to produce a desired thickness of a layer of the surface material, such as to produce a desired stripe height between a surface of a slider assembly and one or more transducer heads located below the surface of the slider assembly. A second possible objective is, by removal of the surface layer material, to produce a desired shape of a surface of the substrate, for example a desired shape of a surface of a slider element of a slider assembly.

A lapping process may be a multiple step process, beginning with an initial removal step, often called a "rough lapping" step, and ending with a polishing step, often called "kiss lapping" or "polishing lapping" step. The rough lapping step, or a combination of two or more rough lapping steps, may be performed to remove as much as 20 microns of material from a substrate surface, such as from a surface of a slider bar. The kiss lapping step is a final polishing and a precision shaping step. Kiss lapping is less aggressive in its removal of material from the substrate as compared to a rough lapping step or steps. A kiss lapping step may typically result in removal of not more than 100 nanometers of material from the substrate surface, e.g., at a location of a stripe height measurement. A kiss lapping step requires flexible mounting of the substrate to the carrier, to achieve desired global shaping of the slider element of a slider assembly during the lapping step. Accordingly, pressure-sensitive adhesives having mechanical properties as described herein can be useful in the kiss lapping step of a slider assembly, to result in desired global shaping of the slider element of the slider assembly, in addition to a desire amount of removal of surface layer material covering one or more transducer heads at an end of the slider assembly (measured as "stripe height"), that end being the "trailing end" of the slider assembly during the lapping step as the slider assembly contacts the abrasive material, with relative motion.

An example of a substrate 24 (see FIGS. 2 and 3) is a slider bar, which includes a contacted surface or surface layer made of a combination of aluminum oxide ($Al_2O_3$) and titanium carbide (TiC). At the start of a final lapping step, the thickness of the surface layer has previously been reduced by a rough lapping step. During the kiss lapping step, the amount of the material (e.g., aluminum oxide ($Al_2O_3$) and titanium carbide (TiC)) that is removed from the surface layer, e.g., at a location of a stripe height, will usually be an amount that is less than about 100 nanometers, for example from about 5 to about 80 nanometers of material, or from about 10 to about 30, 40, 50, or 60 nanometers of material.

Figure 2:
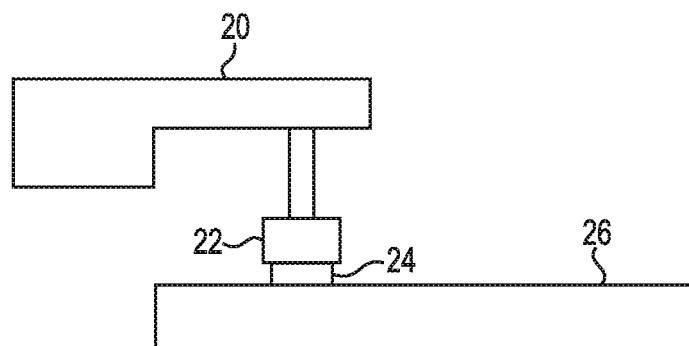
FIG. 2 is a schematic side view of an embodiment of an exemplary lapping process.

Referring now to FIG. 2, schematically depicted is a lapping system used for a kiss lapping step of a substrate, for example a slider bar. To an actuator or fixture 20 is operably connected carrier 22, to which is mounted slider bar 24 (or another substrate), by adhesive stack (see FIG. 1) (not including release liners 2 and 12). One surface (contacted surface) of substrate (e.g., slider bar) 24 is illustrated as contacting a moving abrasive surface (the upper surface) of lapping plate 26 (also often referred to as a platen). Adhesive stack 10 includes adhesive 4, which is secured to substrate 24, and adhesive 8, which is secured to a surface of carrier 22. Adhesive stack 10 also includes base layer 6, which is located and adhesively held between adhesive 4 and adhesive 8.

Not shown in FIG. 2, present on the upper surface of lapping plate 26, are abrasive particles or an abrasive surface, to make up an abrasive material for contacting the contacted surface of substrate 24. The abrasive particles or surface may be present in a slurry or may be fixed to the surface of lapping plate 26, for example by adhesive or by electroplate. Also typically present at the surface of lapping plate 26 is a lubricant such as an oil, e.g., mineral oil. In use, lapping plate 26 is rotated relative to slider bar 24, which can remain stationary. One surface (the "contacted surface") of slider bar 24 is held in contact with the moving abrasive material surface of lapping plate 26 with a desired amount of pressure (e.g., less than 25 pounds per square inch, such as from about 5 to about 20 pounds per square inch). The abrading action caused by the moving abrasive material removes material from the contacted surface of slider bar 24, e.g., to result in a desired stripe height and to also provide a desired shape of the contacted surface.

Referring now to FIG. 3, an embodiment of an exemplary carrier 22 is illustrated, having secured thereto substrate (e.g., slider bar) 24 by use of adhesive stack 10 placed between a surface of carrier 22 and the backside surface of substrate 24. Carrier 22 includes a base 28, for mounting carrier 22 to fixture 20. Base 28 is a rigid base, typically made of material such as metal, glass, polymer, or ceramic. Base 28 may be a single-piece or a multiple-piece fixture, and may include any number of optional features such as pliable fingers or nodes (see for example, U.S. Pat. No. 8,066,547 to Schuh et al.), actuation points along the length of carrier 22 (see for example, U.S. Pat. No. 6,475,064 to Hao et al.), and other elements designed to improve, affect, or control one or more the dimensions or the shape of the contacted surface of a substrate such as slider assemblies of slider bar 24 during the lapping process. Base 28 may have incorporated therewith circuitry (e.g., flexible circuitry) for monitoring an amount of material removed from a substrate, e.g., at a stripe height of individual slider assemblies of a slider bar 24, or of groups of adjacent slider assemblies of slider bar 24.

More generally, according to certain lapping methods, a contacted surface of a slider bar or other substrate is lapped by use of a lapping machine, e.g., as illustrated, with motion (e.g., rotating motion) of the abrasive material and contact of the abrasive material with the contacted surface of the substrate while the substrate is held at the surface of the carrier. For lapping of a slider bar, the progress of the lapping step is monitored to achieve a predetermined stripe height for slider assemblies of the slider bar. As the abrasive material contacts the substrate, it advances from the leading end and middle portion of the slider assembly, which contain the slider elements of the slider assemblies, to the trailing end, which contains the one or more transducing heads and at which location the stripe height is measured. The stripe height of single slider assemblies on the slider bar may be monitored, and adjustments may be made to the process to remove more or less material from the trailing end of the slider assembly by application of a greater or lesser amount of pressure to one or more slider assemblies on the slider bar. When the desired stripe height of the slider assemblies on the slider bar is achieved, the lapping step can be stopped and the lapped slider assemblies can be removed from the carrier.

According to the invention, including the use of an adhesive as adhesive 4 of FIG. 3, having properties described herein, including elastic modulus and tan delta, the lapping step also achieves a desired shape of the slider element of the slider assemblies of the slider bar. In specific, these properties allow for an amount of flexibility and elasticity of the adhesive that will produce an amount of movement, i.e., twisting, of the slider bar and its individual slider assemblies, to produce slider elements of the slider assemblies that have desired global shaping.

The invention claimed is:

1. Elastomeric adhesive film comprising adhesive polymer, wherein the adhesive polymer comprises one or more polyacrylates, the adhesive film being useful to adhere a microelectronic device substrate to a carrier during a step of lapping a surface of the microelectronic substrate, the adhesive film having:
an elastic modulus in a range from 100 to 500 kilopascals measured at 25 degrees Celsius, a Tan Delta in a range from 0.05 to 0.2 measured at 25 degrees Celsius.

2. The adhesive film as recited at claim 1 having a shear strength in a range from 50 to 1000 grams.

3. The adhesive film as recited at claim 1, containing less than 1 weight percent silicone-based polymer, based on total weight adhesive film.

4. The adhesive film as recited at claim 1 comprising: less than 10 weight percent organic solvent, less than 10 percent entrapped gas by volume, or both.

5. The adhesive film as recited at claim 1 wherein the adhesive polymer contains at least 90 weight percent polyurethane derived from polyisocyanate and polyol, based on total weight adhesive polymer.

6. The adhesive film recited at claim 5 wherein the polyurethane is derived from:
polyisocyanate comprising at least 99 weight percent di-isocyanate, based on total weight polyisocyanate, and polyol comprising at least 99 weight percent diol, based on total weight polyol.

7. The adhesive film as recited at claim 5 wherein the polyisocyanate is an aromatic di-isocyanate and the polyol is a polyether diol.

8. The adhesive film as recited at claim 5 wherein the polyol is a diol having a molecular weight below about 300.

9. The adhesive film as recited at claim 5 wherein the polyurethane polymer is derived from reactive materials that comprise less than 0.5 weight percent crosslinker.

10. The adhesive film as recited at claim 5 wherein the adhesive film contains less than 1 part per million (ppm) tin.

11. The adhesive film as recited at claim 5 wherein the one or more polyacrylates comprise poly((meth) acrylate).

12. The adhesive film as recited at claim 1, wherein the adhesive polymer contains at least 99 weight percent poly ((meth)acrylate), based on total weight adhesive polymer.

13. The adhesive film as recited at claim 12 wherein the poly((meth)acrylate) is selected from poly(methylmethacrylate) homopolymer, poly((meth)acrylate) copolymer, and combinations thereof.

14. The adhesive film as recited at claim 12 wherein the adhesive film comprises at least 70 weight percent poly (methylmethacrylate) homopolymer, poly((meth)acrylate) copolymer, and combinations thereof.

15. The adhesive film as recited at claim 12 wherein the adhesive film comprises:
from 70 to 100 weight percent poly((meth) acrylate) adhesive polymer,
from 0 to 30 weight percent tackifier, and
from 0 to 10 weight percent plasticizer, based on total weight adhesive film.

16. The adhesive film as recited at claim 15 wherein the adhesive polymer is derived from reactive materials that contain less than 0.5 weight percent reactive monomer having a functionality of 3 or more.

17. An adhesive film stack comprising the adhesive film of claim 1 in contact with a release liner on a first surface of the film.

18. The adhesive film stack as recited at claim 17 wherein the adhesive film has a thickness in a range from 14 to 21 mils.

19. The adhesive film stack as recited at claim 17 comprising:
a second adhesive layer,
a base layer between the adhesive film and the second adhesive layer, and
a second release liner in contact with the second adhesive layer.

20. The adhesive film stack as recited at claim 19 wherein the second adhesive layer comprises an organic solvent-containing polyacrylate pressure-sensitive adhesive.

* * * * *